(12) United States Patent
Behringer et al.

(10) Patent No.: US 9,172,014 B2
(45) Date of Patent: Oct. 27, 2015

(54) OPTOELECTRONIC SEMICONDUCTOR CHIP AND METHOD FOR PRODUCING AN OPTOELECTRONIC SEMICONDUCTOR CHIP

(71) Applicant: OSRAM Opto Semiconductors GmbH, Regensburg (DE)

(72) Inventors: Martin R. Behringer, Regensburg (DE); Markus Bröll, Freising (DE); Christoph Klemp, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/352,724

(22) PCT Filed: Oct. 11, 2012

(86) PCT No.: PCT/EP2012/070192
§ 371 (c)(1),
(2) Date: Apr. 18, 2014

(87) PCT Pub. No.: WO2013/060578
PCT Pub. Date: May 2, 2013

(65) Prior Publication Data
US 2014/0252398 A1    Sep. 11, 2014

(30) Foreign Application Priority Data

Oct. 28, 2011 (DE) .......................... 10 2011 117 381

(51) Int. Cl.
*H01L 33/58* (2010.01)
*H01L 31/14* (2006.01)
(Continued)

(52) U.S. Cl.
CPC ................ *H01L 33/58* (2013.01); *H01L 33/22* (2013.01)

(58) Field of Classification Search
CPC ............ H01L 31/0583; H01L 31/0312; H01L 31/035227; H01L 29/1608; H01L 29/0676; H01L 29/1606; H01L 29/15; H01L 29/06; H01L 31/00; H01L 31/0547; H01L 31/0543; H01L 31/028; B82Y 10/00
USPC ........ 136/263, 255, 256, 244; 257/79, 84, 99, 257/E33.023, E33.067; 438/93, 94
See application file for complete search history.

(56) References Cited

U.S. PATENT DOCUMENTS

| 6,596,377 B1 * | 7/2003 | Hersee et al. ............... 428/195.1 |
| 2004/0157358 A1 * | 8/2004 | Hiramatsu et al. ............... 438/93 |

(Continued)

FOREIGN PATENT DOCUMENTS

| DE | 10 2008 003 093 | 7/2008 |
| DE | 10 2008 056 175 | 5/2010 |

(Continued)

OTHER PUBLICATIONS

Li et al., "ZnO field-effect transistors prepared by aqueous solution-growth ZnO crystal thin film", Journal of Applied Physics 102, 076101 (2007); doi: 10.1063/1.2773683.*

(Continued)

*Primary Examiner* — Kimberly Rizkallah
*Assistant Examiner* — Brian Turner
(74) *Attorney, Agent, or Firm* — DLA Piper LLP (US)

(57) ABSTRACT

An optoelectronic semiconductor chip includes a semiconductor layer sequence having an active layer that generates an electromagnetic radiation and a light exit side, and a light coupling-out layer applied to the light exit side, wherein the light coupling-out layer includes of radiation-inactive nanocrystals composed of a material transmissive to the radiation generated, and a refractive index of the radiation-transmissive material for the radiation is at least 1.9.

15 Claims, 3 Drawing Sheets

(51) Int. Cl.
*H01L 29/06* (2006.01)
*H01L 33/22* (2010.01)

(56) References Cited

U.S. PATENT DOCUMENTS

| | | | | |
|---|---|---|---|---|
| 2006/0270074 | A1* | 11/2006 | Kim | 438/22 |
| 2007/0290188 | A1* | 12/2007 | Chuo et al. | 257/13 |
| 2009/0278163 | A1* | 11/2009 | Sakamoto et al. | 257/101 |
| 2010/0200881 | A1* | 8/2010 | Masaki | 257/98 |
| 2011/0215295 | A1* | 9/2011 | Lugauer et al. | 257/13 |

FOREIGN PATENT DOCUMENTS

| | | |
|---|---|---|
| DE | 10 2008 062 932 | 6/2010 |
| DE | 10 2009 030 476 | 1/2011 |
| DE | 10 2009 059 887 | 6/2011 |
| DE | 10 2011 116 230 | 4/2013 |
| EP | 1 422 748 | 5/2004 |
| EP | 1 727 217 | 11/2006 |
| EP | 1 818 991 | 8/2007 |
| WO | 2007/031929 | 3/2007 |
| WO | 2008/140611 | 11/2008 |

OTHER PUBLICATIONS

Definition of acicular from thefreedictionary.com.*
Ronning, C, et al., "Nanodrähte, Nanosägen, Nanospiralen," *Phys. Unserer Zeit*, Jan. 2006 (37), pp. 34-40, Wiley-VCH Verlag GmbH & Co. KGaA, Weinheim, www.phiuz.de.
Voss, T., "Zinkoxid-Nanodraht-Led's," Universität Bremen, Fachbereich Physik, Optoelektronik, 2009, pp. 1-2.

* cited by examiner

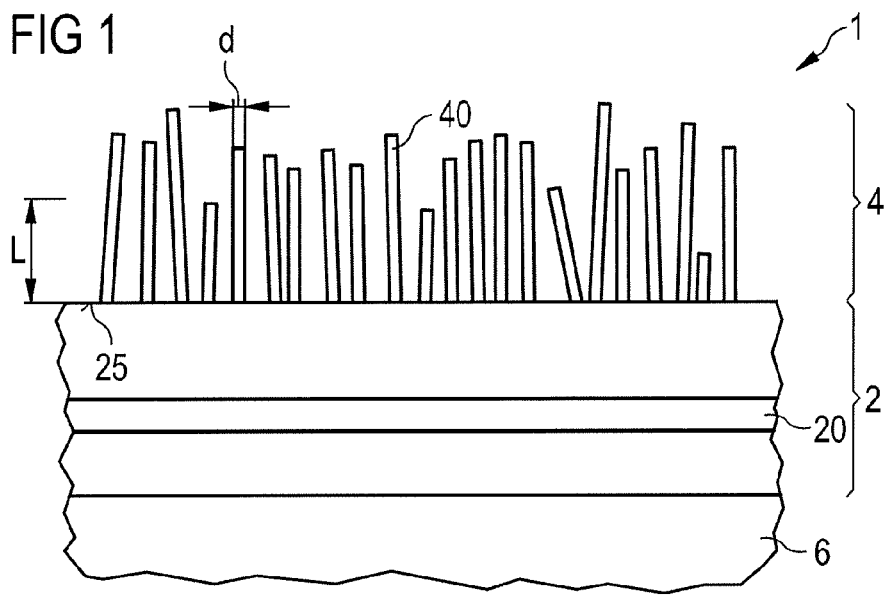
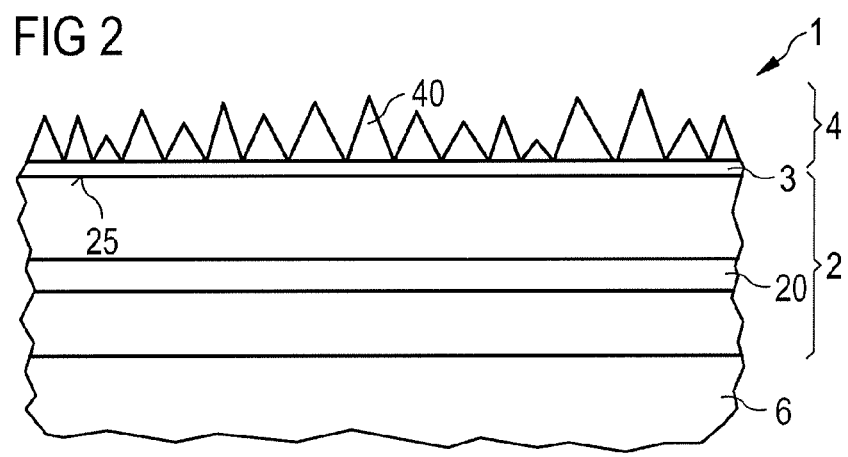
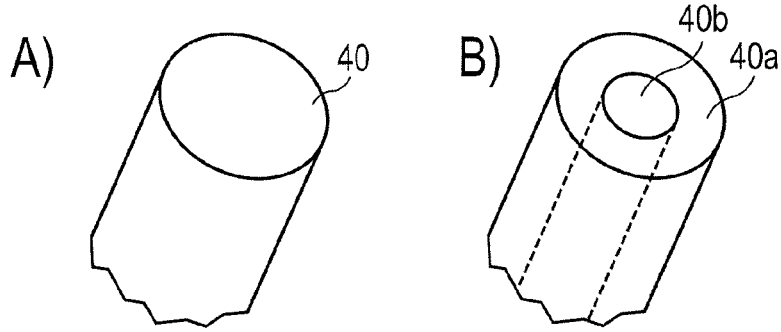

OPTOELECTRONIC SEMICONDUCTOR CHIP AND METHOD FOR PRODUCING AN OPTOELECTRONIC SEMICONDUCTOR CHIP

TECHNICAL FIELD

This disclosure relates to an optoelectronic semiconductor chip and a method of producing an optoelectronic semiconductor chip.

BACKGROUND

It could be helpful to provide an optoelectronic semiconductor chip having a high light coupling-out efficiency.

SUMMARY

We provide an optoelectronic semiconductor chip including a semiconductor layer sequence having an active layer that generates an electromagnetic radiation and a light exit side, and a light coupling-out layer applied to the light exit side, wherein the light coupling-out layer comprises or consists of radiation-inactive nanocrystals composed of a material transmissive to the radiation generated, and a refractive index of the radiation-transmissive material for said radiation is at least 1.9.

We also provide a method of producing an optoelectronic semiconductor chip including a semiconductor layer sequence having an active layer that generates an electromagnetic radiation and a light exit side, and a light coupling-out layer applied to the light exit side, wherein the light coupling-out layer comprises or consists of radiation-inactive nanocrystals composed of a material transmissive to the radiation generated, a refractive index of the radiation-transmissive material for said radiation is at least 1.9, and in the nanocrystals comprise ZnO, the method including producing the nanocrystals from an aqueous solution, and growing them in a self-organized manner.

BRIEF DESCRIPTION OF THE DRAWINGS

FIGS. 1, 2, 6, 7 and 8 show schematic sectional illustrations of examples of our optoelectronic semiconductor chips.

FIGS. 3 to 5 show illustrations of nanocrystals for our optoelectronic semiconductor chips.

DETAILED DESCRIPTION

Figure 4:
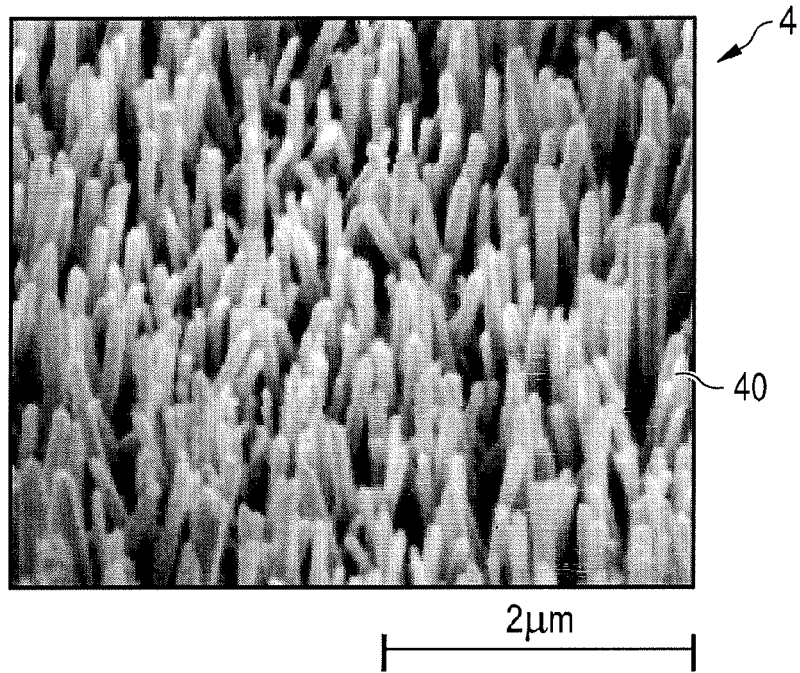

Our optoelectronic semiconductor chip may comprise a semiconductor layer sequence having at least one active layer that generates an electromagnetic radiation. The semiconductor layer sequence has a light exit side. The light exit side is formed, in particular, by a planar interface of the semiconductor layer sequence situated at a side of the semiconductor layer sequence facing away from a carrier and is preferably oriented perpendicularly to a growth direction of the semiconductor layer sequence.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or else an arsenide compound semiconductor material such as $Al_nIn_{1-n-m}Ga_mAs$, wherein respectively $0 \leq n \leq 1$, $0 \leq m \leq 1$ and $n+m \leq 1$. In this case, the semiconductor layer sequence can comprise dopants and additional constituents. For the sake of simplicity, however, only the essential constituents of the crystal lattice of the semiconductor layer sequence, that is to say Al, As, Ga, In, N or P, are indicated, even if these can be replaced and/or supplemented in part by small amounts of further substances.

The semiconductor layer sequence comprises at least one active layer that generates an electromagnetic radiation. The active layer comprises, in particular, at least one pn junction and/or at least one quantum well structure. A radiation generated by the active layer during operation is, in particular, in the spectral range of 400 nm to 1050 nm or 430 nm to 650 nm.

The semiconductor chip may comprise a light coupling-out layer. The light coupling-out layer is applied indirectly or, preferably, directly to the light exit side of the semiconductor layer sequence. The light coupling-out layer increases the coupling-out efficiency of radiation generated in the active layer during operation of the semiconductor chip from the semiconductor layer sequence and from the semiconductor chip.

The light coupling-out layer may comprise nanocrystals or consist of nanocrystals. The light coupling-out layer and/or the nanocrystals are shaped from a material or consist of such a material which has, for the radiation generated in the active layer, a refractive index of at least 1.5 or of at least 2.0 or of at least 2.5. In other words, the light coupling-out layer and/or the nanocrystals are/is formed from an optically high refractive index material.

Nanocrystals are disclosed in US 2011/0215295 A1, the subject matter of which is incorporated herein by reference.

The refractive index of the material of the light coupling-out layer and/or of the nanocrystals may deviate from an average refractive index of the semiconductor layer sequence by at most 1.5 or by at most 0.5 or by at most 0.25. In other words, the refractive indices of the material of the light coupling-out layer and/or of the nanocrystals and of the semiconductor layer sequence are then similar to one another.

The nanocrystals may be radiation-inactive. In other words, the nanocrystals are then not designed to generate electromagnetic radiation during operation of the optoelectronic semiconductor chip or to convert radiation generated in the active layer into radiation having a different wavelength. In particular, the nanocrystals are free of an active region that generates an electromagnetic radiation and/or free of a conversion medium for wavelength conversion.

The optoelectronic semiconductor chip may comprise a semiconductor layer sequence having an active layer that generates an electromagnetic radiation. The semiconductor layer sequence has a light exit side, to which a light coupling-out layer is applied. The light coupling-out layer comprises or consists of radiation-inactive nanocrystals composed of a material transmissive to the radiation generated. A refractive index of the material of the light coupling-out layer and/or of the nanocrystals for the radiation generated in the active layer is at least 1.5 or at least 2.0 or at least 2.2.

Semiconductor materials for light-emitting diodes such as AlInGaN or InGaAlP have comparatively high refractive indices. As a result, a large proportion of light is reflected at an interface of the semiconductor layer sequence back in the direction into the semiconductor layer sequence on account of total internal reflection. As a result, efficiency can be significantly reduced since absorption losses can occur in the semiconductor layer sequence and/or at electrical contacts.

One way to increase light coupling-out efficiency is to structure a surface of the semiconductor layer sequence, in particular to provide it with roughening. Such roughening can be produced wet-chemically and/or photolithographically by a masking technique and by subsequent etching. However, producing the roughening necessitates a thicker semiconductor layer sequence, which increases growth times for the semiconductor layer sequence. As a result of application of the nanocrystals of the light coupling-out layer, a high light coupling-out efficiency is achievable in conjunction with a comparatively thin semiconductor layer sequence to be grown.

The material of the light coupling-out layer and/or of the nanocrystals may differ from a material of the semiconductor layer sequence. In particular, the light coupling-out layer and the semiconductor layer sequence may be based on different material systems. Essential material constituents of the semiconductor layer sequence and of the light coupling-out layer can differ from one another. For example, the material of the nanocrystals is not a semiconductor material such as GaN.

At least some of the nanocrystals or all of the nanocrystals may be embodied in an acicular fashion. That can mean that the nanocrystals have an elongated form. The nanocrystals can be cylinder-like structures, but cylinder-like does not preclude a cross section of the nanocrystals deviating from a round form or from a circular form.

The degree of coverage of the nanocrystals, relative to an area of the light exit side, may be at least 40% or at least 55% or at least 60%. Alternatively or additionally, the degree of coverage is at most 90% or at most 80% or at most 75%. In this case, the degree of coverage should be determined at a region of the light coupling-out layer and/or of the nanocrystals closest to the light exit side. In other words, the degree of coverage denotes, in particular, an area proportion of the light exit side over which the nanocrystals have been grown directly.

At least some of the nanocrystals or all of the nanocrystals may be pyramidal. In this case, pyramidal includes conical. In particular, the nanocrystals then have a tip facing in the direction away from the light exit side. It is possible for the tip of the nanocrystals to be atomically pointed. Preferably, an area at the tip, which can also be flattened and oriented parallel to the light exit side, is at most 400 $nm^2$ or at most 5000 $nm^2$ or at most 40000 $nm^2$.

The degree of coverage of the light exit side with the nanocrystals may be at least 70% or at least 80% or at least 85%. Preferably, the degree of coverage is at least 90% or at least 95%. Particularly preferably, the entire light exit side is covered by the nanocrystals. This applies particularly if the nanocrystals are grown in a pyramidal fashion.

The nanocrystals may have an average diameter of at least 50 nm or of at least 100 nm or of at least 150 nm or of at least 200 nm. Alternatively or additionally, the average diameter is at most 1 µm or at most 500 nm or at most 300 nm. A standard deviation of the average diameter is preferably at most 30 nm or at most 15 nm.

The nanocrystals may have an average length of at least 300 nm or of at least 500 nm or of at least 1 µm. Alternatively, or additionally, the average length is at most 4 µm or at most 2 µm or at most 1.5 µm. A standard deviation of the average length is, for example, at most 100 nm or at most 50 nm.

The nanocrystals may be applied in places or over the entire light exit side directly on the semiconductor layer sequence. In other words, a material of the nanocrystals is then in direct physical contact with a material of the semiconductor layer sequence at least in places.

A seed layer may be applied on the light exit side in places or over the whole area. The seed layer ensures that the nanocrystals grow thereon in particular in a regular, dense arrangement. Preferably, the seed layer is situated directly on the light exit side and thus in physical contact with the semiconductor layer sequence. The nanocrystals are furthermore preferably situated directly at a side of the seed layer which faces away from the semiconductor layer sequence, and are in physical contact with said seed layer.

The seed layer may have a thickness of at most 200 nm or of at most 50 nm or of at most 20 nm or of at most 10 nm or of at most 5 nm. Alternatively or additionally, the thickness of the seed layer is at least two monolayers or at least 1 nm or at least 2 nm or at least 5 nm.

The seed layer may be a metallic layer. By way of example, the seed layer is formed by a thin gold layer or by a thin layer composed of a gold alloy. The seed layer is transmissive to a radiation generated in the active layer and absorbs and/or reflects the radiation preferably to the extent of at most 10% or to the extent of at most 5%.

The seed layer may be formed by a layer of a metal oxide, preferably ZnO or $TiO_2$. The seed layer then has, in particular, a thickness of 30 nm to 200 nm.

The seed layer may be formed by mutually separated, non-contiguous material islands. The islands preferably have an average diameter also exhibited by the nanocrystals to be grown thereon. Such islands can be formed from gold, ZnO, InGaN or AlGaN, for example.

Longitudinal axes of the nanocrystals may be oriented perpendicularly or substantially perpendicularly to the light exit side. That is to say that at least some of the nanocrystals or substantially all of the nanocrystals may face in a direction away from the light exit side. A standard deviation of an angle of the longitudinal axes of the nanocrystals with respect to the light exit side, relative to a perpendicular, is preferably at most 25° or at most 15° or at most 5°. In other words, virtually all the nanocrystals are then oriented substantially perpendicularly to the light exit side. The longitudinal axis can be oriented parallel to a main growth direction of the nanocrystals.

The standard deviation of the angle between the longitudinal axes and the perpendicular to the light exit side may be at least 5° or at least 10° or at least 20°. Alternatively or additionally, the standard deviation is at most 35° or at most 25° or at most 20°. In other words, the nanocrystals then have, relative to their longitudinal axes, a large angular distribution.

The nanocrystals may be shaped with one or more of the materials mentioned below or consist of one or more of the materials mentioned below: ZnO, $ZrO_2$, $TiO_2$, $Al_2O_3$, ZnS, ZnSe, $TiO_xN_{1-x}$, $Ta_2O_5$, BN, AlN, $SnO_2$.

The materials mentioned for the nanocrystals and/or the light coupling-out layer can be pure materials. It is likewise possible for dopings to be added to the materials. Preferably, however, the nanocrystals and/or the light coupling-out layer are/is free of additives such as dopings.

The light coupling-out layer and/or the nanocrystals may be shaped from an electrically insulating material. In other words, the nanocrystals may not be designed to conduct electric current, neither in a direction parallel nor in a direction perpendicular to the light exit side of the semiconductor layer sequence.

One or more passivation layers is or may be situated at a side of the light coupling-out layer facing away from the semiconductor layer sequence. The passivation layer is preferably shaped from a transparent material transmissive to radiation generated in the active layer, for example, from a silicon oxide, a silicon nitride or a silicon oxynitride. The passivation layer is, in particular, a continuous, closed layer. The passivation layer protects the light coupling-out layer and/or the nanocrystals and the semiconductor layer sequence against external influences such as atmospheric humidity or atmospheric oxygen.

An average thickness of the passivation layer may be at most 150 nm or at most 100 nm or at most 50 nm. Preferably, the average thickness of the passivation layer, relative to the geometrical thickness of the passivation layer and to a vacuum wavelength of the radiation, is ¼n of the wavelength of the radiation generated in the active layer, with a tolerance of at most 10% or of at most 5%. In this case, the wavelength denotes in particular that wavelength at which the highest intensity is present in the radiation spectrum emitted by the semiconductor layer sequence, this therefore also being designated as peak wavelength. n denotes the refractive index of the material of the passivation layer for this wavelength.

The nanocrystals, as seen in a cross section, may have a hexagonal basic shape or a round basic shape. In particular, the nanocrystals have the shape of a regular hexagon in cross section.

The nanocrystals may be distributed regularly and/or arranged regularly over the entire light exit side. In other words, density fluctuations of the nanocrystals, relative to a number of nanocrystals per unit area, over the light exit side are then negligible and/or the nanocrystals, within the scope of the production tolerances, are all shaped identically.

The nanocrystals may be arranged at the light exit side at lattice points of a regular lattice. This regular arrangement is present regionally or over the entire light exit side. The lattice is preferably a hexagonal lattice.

One or a plurality of partial regions of the light exit side may be free of the nanocrystals. It is likewise possible that fewer and/or smaller nanocrystals and/or nanocrystals having a different angular distribution are present in the one or in the plurality of partial regions than in remaining regions of the light exit side.

The light exit side may have a central region and an edge region, wherein the edge region preferably forms the partial region. The edge region can extend all around the central region, as seen in plan view. Preferably, the seed layer is applied only in the central region. By way of example, the edge region has a width of at most 5% or of at most 10% or of at most 15% of an average edge length of the light exit side, as seen in plan view. The edge region can extend in a constant or varying width around the central region; a deviating width of the central region can be present in corner regions, in particular.

Furthermore, we provide a method of producing an optoelectronic semiconductor chip. In particular, a semiconductor chip as specified in conjunction with one or more of the examples mentioned above can be produced by the method. Therefore, features of the method are also disclosed for the optoelectronic semiconductor chip, and vice versa.

The nanocrystals may be grown directly on the semiconductor layer sequence or directly on the seed layer in a direction away from the semiconductor layer sequence. It is possible for the growth directions of the semiconductor layer sequence and of the nanocrystals to be oriented antiparallel to one another.

The semiconductor chips may be grown in a self-organized fashion. In other words, it is then not necessary for a prestructuring of an area on which the nanocrystals grow then to take place. Alternatively, it is likewise possible for the nanocrystals to be grown in a structured fashion, for instance, by a masking technique in conjunction with a structured seed layer.

The nanocrystals may be produced from an aqueous solution. To grow the nanocrystals, the semiconductor layer sequence is then dipped into such an aqueous solution, for example. Growth of the nanocrystals preferably takes place in the wafer assemblage, that is to say before a wafer onto which the semiconductor layer sequence is grown is singulated to form individual semiconductor chips.

Production methods for such nanocrystals are described, for example, in Ronning et al. in Physik Unserer Zeit, January 2006 (37), pages 34 to 40, and in DE 10 2009 030 476 A1, the subject matter of which is incorporated herein by reference.

An optoelectronic semiconductor chip described here is explained in greater detail below on the basis of examples with reference to the drawings. In this case, identical reference signs indicate identical elements in the individual figures. In this case, however, relations to scale are not illustrated. Rather, individual elements may be illustrated with an exaggerated size to afford a better understanding.

FIG. 1 shows an example of an optoelectronic semiconductor chip 1. On a carrier 6 there is applied a semiconductor layer sequence 2 having an active layer 20 and a light exit side 25 facing away from the carrier 6. The carrier 6 preferably differs from a growth substrate of the semiconductor layer sequence 2. The semiconductor layer sequence 2 is based on InGaAlP, in particular.

A light coupling-out layer 4 comprising a multiplicity of nanocrystals 40 is grown directly on the light exit side 25. The nanocrystals 40 are in direct physical contact with the semiconductor layer sequence 2. The nanocrystals 40 are preferably grown from undoped, pure ZnO.

An average length L of the nanocrystals 40 is approximately 400 nm, for example. An average diameter d of the nanocrystals 40 is approximately 250 nm, for example. With regard to the length L and the diameter d, the nanocrystals 40 have a comparatively small standard deviation. Likewise, all the nanocrystals 40 are oriented perpendicularly to the light exit side 25 with a comparatively small standard deviation. Furthermore, the nanocrystals 40 are shaped identically and distributed uniformly over the entire light exit side 25, within the scope of the production tolerances. The nanocrystals 40 can be shaped in an acicular fashion.

A further example of the semiconductor chip 1 can be seen in FIG. 2. In a departure from FIG. 1, the nanocrystals 40, of which the light coupling-out layer 4 consists, are grown in the form of hexagonal pyramids on the semiconductor layer sequence 2. The tips of the nanocrystals 40 face away from the semiconductor layer sequence 2. The nanocrystals 40 completely cover the light exit side 25, as seen in plan view. All the nanocrystals 40 are shaped identically, within the scope of production tolerances.

Optionally, it is possible, as also in all the other examples, for a seed layer 3 to be situated directly at the light exit side 25, the nanocrystals 30 being grown on seed layer. The seed layer 3 is, for example, a gold layer having a thickness of approximately 5 nm.

A degree of coverage of the light exit side 25 with the nanocrystals 40, directly at the light exit side 25, is approximately two thirds, for example.

FIG. 3 schematically shows possible shapes of nanocrystals 40. In accordance with FIG. 3A, the nanocrystals 40 are solid cylinders or solid-cylinder-like shapes. The term cylinder-like can include polygonal cross sections such as hexagons.

FIG. 3B illustrates nanocrystals having a shell in the form of a hollow cylinder 40a and core region 40b, wherein the core region 40b is enclosed all around by the hollow cylinder 40a. In a departure from the illustration in accordance with FIG. 3B, nanocrystals polygonal in cross section can also be present. The core region 40b is preferably filled with a material. The material in the core region 40b can be a different material from the hollow cylinder 40a. By way of example, a refractive index of the material in the core region 40b is greater than in the hollow cylinder 40a. Alternatively, the core region 40b can be filled with a gas or evacuated.

FIG. 4 illustrates a photograph of regularly grown nanocrystals 40. The nanocrystals 40 are distributed uniformly, oriented substantially perpendicularly to a growth area and, within the scope of production tolerances, shaped identically. By way of example, the nanocrystals 40 in accordance with FIG. 4 can be those as depicted schematically in FIG. 1.

Figure 5:
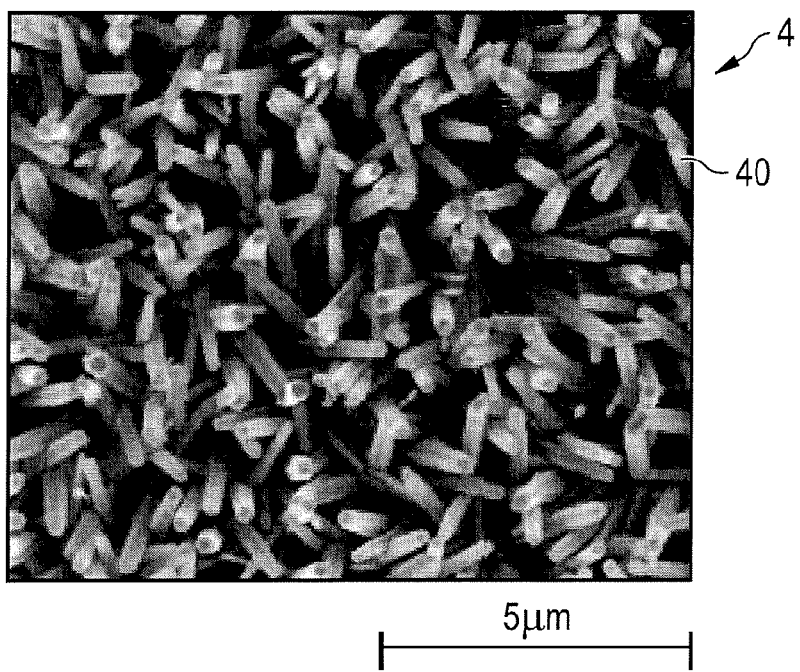

The nanocrystals 40, as illustrated in FIG. 5, have a comparatively large angular distribution, unlike in FIG. 4. An arrangement of the nanocrystals in accordance with FIG. 5 is comparatively irregular.

Figure 6:
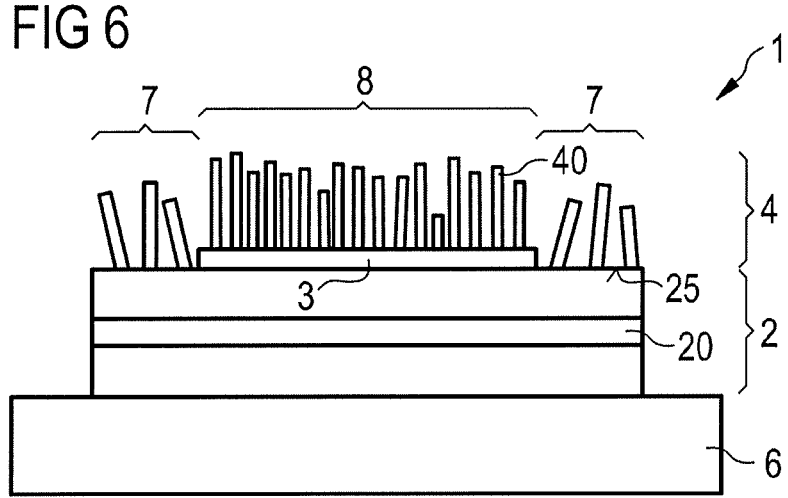

In the case of the example of the semiconductor chip 1 in accordance with FIG. 6, the light exit side 25 has a central region 8 and an edge region 7. The edge region 7 can extend all around the central region 8, as seen in plan view. The seed layer 3 is applied in the central region 8, the nanocrystals 40 being grown regularly and comparatively densely on the seed layer. In the edge region 7, the seed layer 3 is absent and the nanocrystals 40 are grown with a reduced density and/or comparatively irregularly. An emission characteristic of the semiconductor chip 1 can be set by such a division of the light exit side 25 into the edge region and into the central region 8. By way of example, the central region 8, relative to an edge length of the semiconductor layer sequence 2, has a proportion of 50% to 90% or 60% to 85%.

Figure 7:
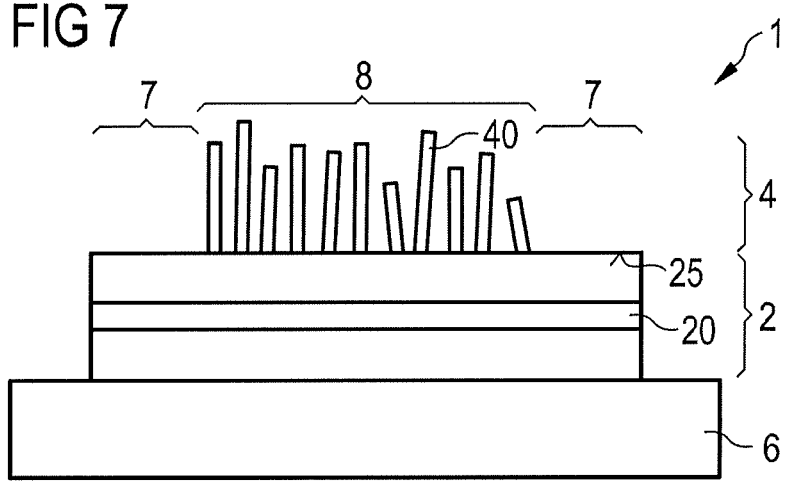

In the case of the example in accordance with FIG. 7, the nanocrystals 40 are applied only in the central region 8. By way of example, the nanocrystals 40 are removed from the edge region 7 after growth. In other words, the nanocrystals 40 were originally produced over the entire light exit side 25 and subsequently removed in places.

It is possible for the central region 8 and the edge region 7 to be interchanged with regard to the seed layer 3 and the density and/or occupancy with nanocrystals 40. In that case, by way of example, the nanocrystals 40 are applied only in the edge region 7 and the central region 8 is then free of the nanocrystals 40, for example.

Figure 8:
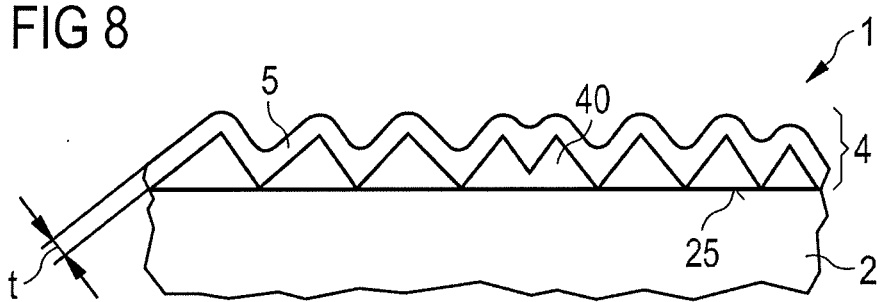

In the case of the example of the semiconductor chip 1 in accordance with FIG. 8, a passivation layer 5 is situated at a side of the nanocrystals 40 of the light coupling-out layer 4 facing away from the light exit side 25. The passivation layer 5 protects the nanocrystals 40, which are grown from ZnO, for example, against environmental influences such as moisture and oxygen. A thickness t of the passivation layer 5 is approximately 70 nm, for example. The passivation layer 5 is a closed layer, for example, composed of $SiO_2$. Such passivation layers 5 can also be present in all the other examples.

The passivation layer 5 can be formed from a material having a comparatively low refractive index. As a result of the small thickness of the passivation layer 5, which is significantly less than a wavelength of the radiation generated in the semiconductor layer sequence 2, the passivation layer 5 has no or no significant effect, however, on a light coupling-out efficiency.

Our chips and methods described here are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic semiconductor chip comprising a semiconductor layer sequence having an active layer that generates an electromagnetic radiation and a light exit side, and a light coupling-out layer applied to the light exit side, wherein
   the light coupling-out layer comprises or consists of radiation-inactive nanocrystals composed of a material transmissive to the radiation generated,
   a refractive index of the radiation-transmissive material for said radiation is at least 1.9,
   a seed layer is applied at least in places directly on the light exit side,
   the seed layer, in a plan view, is restricted to a central region of the light exit side, the central region being surrounded by a partial region of the light exit side being free of the seed layer,
   the nanocrystals are applied directly on a side of the seed layer facing away from the semiconductor layer sequence, and
   the partial region of the light exit side is free of the nanocrystals, or fewer and/or smaller nanocrystals are applied in the partial region than in the central region of the light exit side.

2. The optoelectronic semiconductor chip according to claim 1,
   wherein at least some of the nanocrystals are acicular;
   a degree of coverage of the light exit side with the nanocrystals is 55% to 80%,
   a seed layer is applied at least in places directly on the light exit side and the nanocrystals are situated directly at a side of the seed layer facing away from the semiconductor layer sequence, and
   a partial region of the light exit side is free of the nanocrystals, or fewer and/or smaller nanocrystals are applied in the partial region than in remaining regions of the light exit side.

3. The optoelectronic semiconductor chip according to claim 1,
   wherein at least some of the nanocrystals are pyramidal, and
   a degree of coverage of the light exit side with the nanocrystals is 85% to 100%.

4. The optoelectronic semiconductor chip according to claim 1, wherein the nanocrystals have an average diameter of 50 nm to 1 µm and an average length of 300 nm to 2 µm.

5. The optoelectronic semiconductor chip according to claim 1, wherein the nanocrystals are applied at least in places directly on the light exit side of the semiconductor layer sequence.

6. The optoelectronic semiconductor chip according to claim 1, wherein the seed layer is a metallic and light-transmissive layer or a layer composed of or comprising a metal oxide, a thickness of the seed layer is at most 200 nm, and the seed layer is a continuous layer or is formed from mutually separated islands.

7. The optoelectronic semiconductor chip according to claim 1, wherein longitudinal axes of the nanocrystals with a standard deviation of at most 5°, are oriented perpendicularly to the light exit side.

8. The optoelectronic semiconductor chip according to claim 1, wherein the nanocrystals comprise one or more of the materials: ZnO, $ZrO_2$, $TiO_2$, $Al_2O_3$, ZnS, ZnSe, $TiO_xN_{1-x}$, $Ta_2O_5$, BN, AlN, $SnO_2$ or consist of one or more of these materials.

9. The optoelectronic semiconductor chip according to claim 1,
   wherein a passivation layer is applied at a side of the light coupling-out layer facing from the semiconductor layer sequence, and wherein an average thickness of the passivation layer, with a tolerance of at most 10%, is $\lambda/4n$ and n denotes the refractive index of the passivation layer and $\lambda$ denotes a wavelength of radiation generated in the semiconductor layer sequence.

10. The optoelectronic semiconductor chip according to claim 1, wherein the nanocrystals, as seen in a cross section, have a hexagonal basic shape.

11. The optoelectronic semiconductor chip according to claim 1, wherein the nanocrystals consist of ZnO and are distributed in a regular arrangement over the entire light exit side.

12. The optoelectronic semiconductor chip according to claim 1, wherein the light exit side is formed by an interface of the semiconductor layer sequence.

13. The optoelectronic semiconductor chip according to claim 1, wherein the seed layer is formed from mutually separated islands.

14. An optoelectronic semiconductor chip comprising a semiconductor layer sequence having an active layer that generates an electromagnetic radiation and a light exit side, and a light coupling-out layer applied to the light exit side, wherein
the light coupling-out layer comprises or consists of radiation-inactive nanocrystals composed of a material transmissive to the radiation generated,
a refractive index of the radiation-transmissive material for said radiation is at least 1.9,
a seed layer is applied at least in places directly on the light exit side,
the seed layer, in a plan view, is restricted to a central region of the light exit side, the central region being surrounded by a partial region of the light exit side being free of the seed layer,
the nanocrystals are applied directly on a side of the seed layer facing away from the semiconductor layer sequence,
the partial region of the light exit side is free of the nanocrystals, or fewer and/or smaller nanocrystals are applied in the partial region than in the central region of the light exit side, and
the central region, relative to an edge length of the semiconductor layer sequence, has a proportion of 50% to 90%.

15. A method of producing an optoelectronic semiconductor chip, the method comprising:
forming a semiconductor layer sequence having an active layer that generates an electromagnetic radiation, a light exit side, and a light coupling-out layer applied to the light exit side, wherein the light coupling-out layer comprises or consists of radiation-inactive nanocrystals composed of a material transmissive to the radiation generated, a refractive index of the radiation-transmissive material for said radiation is at least 1.9, wherein the nanocrystals comprise ZnO,
applying a seed layer at least in locations directly on the light exit side, wherein the seed layer, in a plan view, is restricted to a central region of the light exit side, such that the central region is surrounded by a partial region of the light exit side being free of the seed layer,
growing the nanocrystals, in an aqueous solution and in a self-organized manner, directly on a side of the seed layer facing away from the semiconductor layer sequence, wherein the partial region of the light exit side is free of the nanocrystals, or fewer and/or smaller nanocrystals are applied in the partial region than in the central region of the light exit side.

* * * * *